United States Patent
Sato et al.

(10) Patent No.: US 8,134,181 B2
(45) Date of Patent: Mar. 13, 2012

(54) SEMICONDUCTOR DEVICE

(75) Inventors: Yoshihiro Sato, Tokyo (JP); Sadahiro Kato, Tokyo (JP); Seikoh Yoshida, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 140 days.

(21) Appl. No.: 12/539,736

(22) Filed: Aug. 12, 2009

(65) Prior Publication Data
US 2010/0032716 A1    Feb. 11, 2010

Related U.S. Application Data

(63) Continuation of application No. PCT/JP2007/053198, filed on Feb. 21, 2007.

(30) Foreign Application Priority Data

Feb. 20, 2007   (JP) ................................ 2007-039956

(51) Int. Cl.
*H01L 29/778*   (2006.01)

(52) U.S. Cl. ................. 257/192; 257/190; 257/E29.246

(58) Field of Classification Search .............. 257/190, 257/192, 194, E29.246, E29.247
See application file for complete search history.

(56) References Cited

U.S. PATENT DOCUMENTS

| | | | | |
|---|---|---|---|---|
| 6,147,364 A * | 11/2000 | Itaya et al. | ................... | 257/76 |
| 6,583,468 B2 * | 6/2003 | Hori et al. | ................... | 257/327 |
| 6,706,620 B2 * | 3/2004 | Shibata et al. | ............... | 438/604 |
| 6,829,273 B2 * | 12/2004 | Amano et al. | ............. | 372/45.01 |
| 6,869,702 B2 * | 3/2005 | Shibata et al. | ............... | 428/698 |
| 7,199,408 B2 * | 4/2007 | Miyoshi | ....................... | 257/194 |
| 2002/0100412 A1 * | 8/2002 | Hirayama et al. | ............. | 117/89 |
| 2003/0049916 A1 * | 3/2003 | Surya et al. | ................... | 438/478 |
| 2004/0131866 A1 * | 7/2004 | Shibata et al. | ............... | 428/446 |
| 2005/0274980 A1 * | 12/2005 | Miyoshi | ....................... | 257/192 |
| 2008/0087881 A1 * | 4/2008 | Ueda et al. | .................... | 257/40 |
| 2010/0032716 A1 * | 2/2010 | Sato et al. | .................... | 257/192 |

FOREIGN PATENT DOCUMENTS

| | | | |
|---|---|---|---|
| EP | 1431426 A2 * | 6/2004 | |
| JP | 2000-188285 A | 7/2000 | |
| JP | 2002-057158 A | 2/2002 | |
| JP | 2003-197643 A | 7/2003 | |
| JP | 2004-289005 A | 10/2004 | |
| JP | 2006-179861 A | 7/2006 | |
| JP | 2007-073873 A | 3/2007 | |

* cited by examiner

*Primary Examiner* — David Vu
*Assistant Examiner* — Earl Taylor
(74) *Attorney, Agent, or Firm* — Lowe, Hauptman, Ham & Berner, LLP

(57) ABSTRACT

A semiconductor device includes a substrate; a buffer layer; and a compound semiconductor layer laminated on the substrate with the buffer layer in between. The buffer layer has a dislocation density in a plane in parallel to an in-plane direction thereof, so that a volume resistivity of the buffer layer becomes a substantially maximum value.

19 Claims, 13 Drawing Sheets

(102)/(002) Half Width Ratio

| (102)/(002) Half Width Ratio | Volumetric Resistivity [Ωcm] |
|---|---|
| 0.79 | 5.0E+02 |
| 0.91 | 3.0E+03 |
| 0.92 | 8.0E+02 |
| 0.94 | 7.0E+02 |
| 1.17 | 2.0E+04 |
| 1.22 | 1.0E+05 |
| 1.30 | 2.3E+05 |
| 1.52 | 9.1E+05 |
| 1.62 | 1.8E+07 |
| 1.71 | 1.8E+08 |
| 1.73 | 3.6E+07 |
| 2.30 | 1.8E+10 |

SEMICONDUCTOR DEVICE

CROSS-REFERENCE TO RELATED APPLICATIONS

This application is a continuation of PCT/JP2007/053198 filed on Feb. 21, 2007, which claims priority from Japanese patent application No. 2007-039956, filed on Feb. 20, 2007, the entire content of which is incorporated herein by reference.

BACKGROUND OF THE INVENTION AND RELATED ART STATEMENT

The present invention relates to a semiconductor device having a compound semiconductor layer grown on a substrate with a buffer layer in between.

A compound semiconductor has an inherent property such as a direct transition property. Accordingly, a semiconductor device formed of the compound semiconductor is expected to have a high breakdown voltage and operate at a high frequency. Among the semiconductor devices, a high electron mobility transistor (HEMT), i.e., a type of a field effect transistor (FET), formed of a nitride-based compound semiconductor has been attracting an attention, and a variety of HEMTs have been proposed.

FIG. 15 is a cross sectional view showing a conventional HEMT 11 formed of a GaN-based compound semiconductor as the nitride-based compound semiconductor. In the conventional HEMT 11, a low temperature buffer layer 13 formed of GaN and grown at a low temperature, a buffer layer 14 formed of GaN, an electron drift layer 15 formed of GaN, and an electron supplying layer 16 formed of AlGaN are sequentially grown in this order on a substrate 12 formed of sapphire or the like, thereby forming a hetro-junction structure. A source electrode 17S, a gate electrode 17G, and a drain electrode 17D are disposed on the electron supplying layer 16. A contact layer (not shown) formed of n-GaN is formed between the source electrode 17S or the drain electrode 17D and the electron supplying layer 16 for reducing a contact resistance in between.

In the conventional HEMT 11, a two-dimensional electron gas layer 15a generated beneath the heterojunction interface between the electron drift layer 15 and the electron supplying layer 16 is used as carriers. When the source electrode 17S and the drain electrode 17D are operated, electrons supplied in the electron drift layer 15 move at a high speed through the two-dimensional electron gas layer 15a to the drain electrode 17D. In this case, a voltage applied to the gate electrode 17G is controlled and a thickness of a depletion layer beneath the gate electrode 17G is adjusted, so that the electrons moving from the source electrode 17S to the drain electrode 17G, namely a drain current, can be controlled.

In the semiconductor device such as the HEMT using the nitride-based compound semiconductor such as GaN, generally, a buffer layer needs to have a high resistance in order to restrain a leak current in the buffer layer. If the buffer layer does not have a high resistance in the HEMT 11 shown in FIG. 15, a leak current tends to flow in the buffer layer 14 or the low temperature buffer layer 13 even when the depletion layer beneath the gate electrode 17G is enlarged to turn off the drain current, thereby making it difficult to completely turn off the drain current. To this end, a conventional method has been proposed for increasing a resistance value of the buffer layer (refer to Patent References 1 and 2). Patent References 1 and 2 have disclosed a method of doping an impurity such as Zn, Mg or the like in the buffer layer formed of GaN to increase the resistance value thereof.

Patent References 1: Japanese patent publication No. 2002-057158
Patent References 2: Japanese patent publication No. 2003-197643

In the semiconductor device such as the HEMT having the buffer layer with the increased resistance by impurity doping, a current collapse becomes apparent, i.e., a phenomenon in which electrical characteristics related to an output current vary with time. The current collapse is considered to occur when a part of the doped impurity not activated is charged, thereby preventing the electrons in the two-dimensional electron gas layer from moving.

In the field effect transistor having an insulation gate such as an MISFET (Metal Insulator Semiconductor FET), an MOSFET (Metal Oxide Semiconductor FET), or the like, when the p-type impurity such as Zn, Mg, or the like is doped in the GaN-based compound semiconductor, it is possible to increase the resistance value of the buffer layer according to a density of the impurity, thereby increasing a breakdown voltage of the element. However, when the element has a higher breakdown voltage, a threshold voltage thereof tends to increase, thereby lowering controllability of the field effect transistor.

In view of the problems described above, an object of the present invention is to provide a semiconductor device capable of increasing a resistance of a buffer layer without deteriorating the current collapse, thereby reducing a leak current in the buffer layer. A further object of the present invention is to provide a semiconductor device capable of increasing voltage resistant without increasing a threshold voltage.

SUMMARY OF THE INVENTION

In order to attain the objectives described above, according to the present invention, a semiconductor device includes a substrate; a buffer layer; and a compound semiconductor layer laminated on the substrate with the buffer layer in between. The buffer layer has a dislocation density in a plane in parallel to an in-plane direction thereof so that a volume resistivity of the buffer layer becomes a substantially maximum value.

According to the present invention, in the semiconductor device, the buffer layer may have the dislocation density not less than $2.0 \times 10^8$ cm$^{-2}$ and not greater than $7.0 \times 10^{10}$ cm$^{-2}$.

According to the present invention, a semiconductor device includes a substrate; a buffer layer; and a compound semiconductor layer laminated on the substrate with the buffer layer in between. The buffer layer has a half width of a X-ray rocking curve with respect to a (102) plane thereof so that a volume resistivity of the buffer layer becomes a substantially maximum value.

According to the present invention, in the semiconductor device, the buffer layer may have the half width not less than 300 seconds and not greater than 2,700 seconds.

According to the present invention, in the semiconductor device, the buffer layer may have a ratio of the half width of the X-ray rocking curve with respect to the (102) plane thereof to a half width of an X-ray rocking curve to a (002) plane thereof greater than 1.2.

According to the present invention, in the semiconductor device, the buffer layer may have a ratio of a screw dislocation density thereof to the dislocation density less than 0.12.

According to the present invention, the semiconductor device may further include a low temperature buffer layer formed between the substrate and the buffer layer, and the low temperature buffer layer is formed at a growth temperature of not less than 580° C. and not greater than 620° C.

According to the present invention, in the semiconductor device, the buffer layer includes a composite layer having a first layer formed of a nitride-based compound semiconductor and a second layer formed of a nitride-based compound semiconductor having an Al composition greater than that of the first layer.

According to the present invention, in the semiconductor device, the compound semiconductor layer may be formed of a nitride-based compound semiconductor. Further, the semiconductor device may be a diode or a field effect transistor.

In the semiconductor device according to the present invention, the buffer layer can have a high resistance without deteriorating the current collapse, thereby reducing a leak current in the buffer layer. Furthermore, in the semiconductor device according to the present invention, a breakdown voltage can increase without increasing a threshold voltage.

BRIEF DESCRIPTION OF THE DRAWINGS

FIG. 4-1 shows a crystalline plane of a hexagonal crystal having a Miller index of (102);

FIG. 4-2 shows a crystalline plane of the hexagonal crystal having a Miller index of (002);

FIG. 5-1 is a perspective view showing a structure of a threading dislocation formed in the buffer layer;

FIG. 5-2 is a front view showing the structure of the threading dislocation formed in the buffer layer;

FIG. 5-3 is a plan view showing the structure of the threading dislocation formed in the buffer layer;

DETAILED DESCRIPTION OF THE PREFERRED EMBODIMENTS

Figure 1:
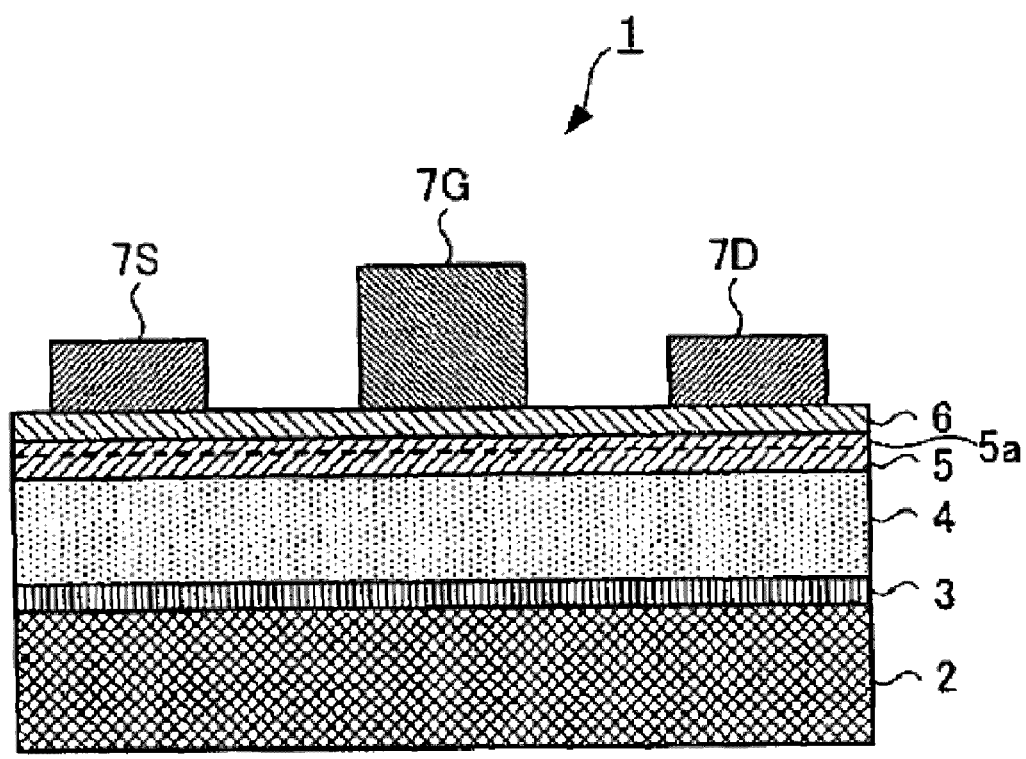
FIG. 1 is a cross sectional view showing a semiconductor device according to a first embodiment of the present invention.

Preferred embodiments of the present invention will be explained in detail below with reference to the drawings. The present invention is not limited to the embodiments. In the drawings, same numeral references designate similar components.

First Embodiment

FIG. 1 is a cross sectional view showing a configuration of an HEMT 1 as a semiconductor device according to the first embodiment. As shown in FIG. 1, the HEMT 1 has a compound semiconductor layer formed on a substrate 2 such as a sapphire substrate or the like via a buffer layer. Specifically, the HEMT 1 has a hetero-junction structure in which a low temperature buffer layer 3 of GaN grown at a low temperature, a buffer layer 4 of GaN, an electron drift layer 5 of GaN, and an electron supplying layer 6 of $Al_{0.3}Ga_{0.7}N$ are formed on the substrate 2 in this order.

Furthermore, the HEMT 1 has a source electrode 7S, a gate electrode 7G, and a drain electrode 7D on the electron supplying layer 6. The source electrode 7S and the drain electrode 7D, which are ohmic electrodes, are formed by depositing Ti, Al, and Au in this order on the electron supplying layer 6. The gate electrode 7G, which is a Schottky electrode, is formed by depositing Pt and Au in this order on the electron supplying layer 6.

In the HEMT 1, a band-gap energy of the electron supplying layer 6 is greater than that of the electron drift layer 5, and a two-dimensional electron gas layer 5a is generated beneath the hetero-junction interface of the two layers, which acts as carriers. Specifically, when the source electrode 7S and the drain electrode 7D are operated, electrons supplied to the electron drift layer 5 move quickly in the two-dimensional electron gas layer 5a toward the drain electrode 7D. A voltage applied to the gate electrode 7G is controlled to change a thickness of a depletion layer beneath the gate electrode 7G, thereby controlling electrons, namely a drain current, moving from the source electrode 7S to the drain electrode 7D.

The buffer layer 4 of the HEMT 1 will be explained next. The buffer layer 4 is formed to have a high resistance so that a leak current generated therein is reduced. When a degree of crystallinity of the buffer layer 4 in a direction parallel to an in-plane direction thereof decreases while maintaining a degree of crystallinity in a direction perpendicular to the in-plane direction, it is possible to increase resistance of the buffer layer 4 at least in the direction along the in-plane direction. Specifically, when an amount of threading dislocation penetrating the buffer layer 4 in the in-plain direction is adjusted, it is possible to obtain a desirable extent of crystallinity.

To this end, first, a relationship between the amount of the threading dislocation and a volume resistivity of the buffer layer 4 is evaluated. A dislocation density of the buffer layer 4 in a predetermined plane parallel to the in-plane direction of the buffer layer 4 is evaluated as a parameter of the amount of the threading dislocation in the buffer layer 4. The relationship between the dislocation density and the volume resistivity is obtained through an actual measurement.

Figure 2:
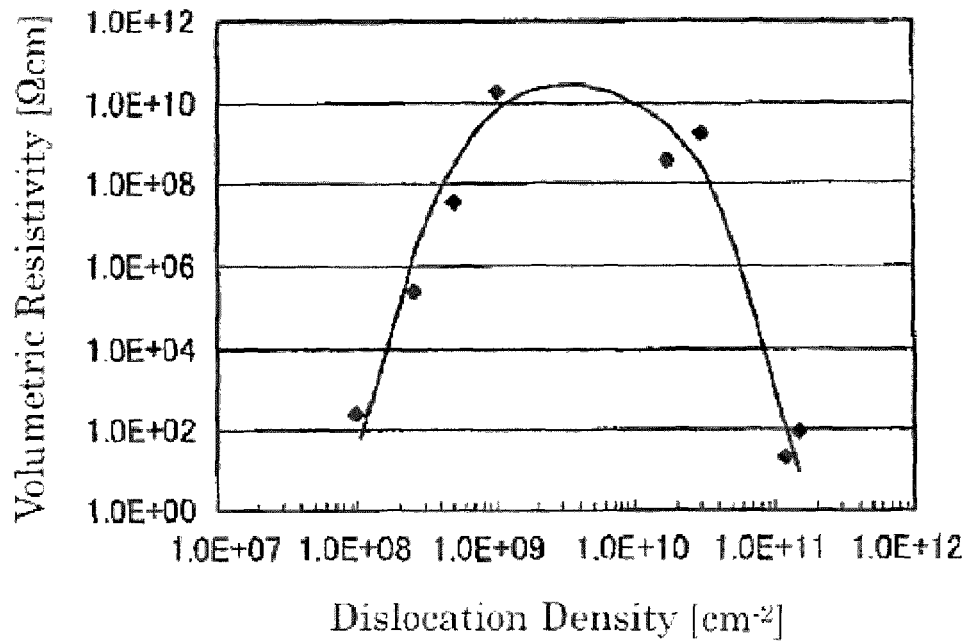
FIG. 2 is a graph showing a relationship between a dislocation density and a volume resistivity of a buffer layer.

FIG. 2 is a graph showing the relationship. As shown in FIG. 2, the volume resistivity of the buffer layer 4 has a maximal value with respect to a change in the dislocation density, and the buffer layer 4 has a higher resistance when the dislocation density is adjusted so that the volume resistivity becomes maximal. Specifically, the dislocation density is preferably not less than $2.0 \times 10^8$ cm$^{-2}$ and not greater than $7.0 \times 10^{10}$ cm$^{-2}$. When the dislocation density of the buffer layer 4 is in the range, the volume resistivity is not less than about $1.0 \times 10^5$ cm.

The dislocation density of the buffer layer 4 can be measured by, for example, counting the dislocation appearing as black spots when the buffer layer 4 is observed by TEM (Transmission Electron Microscope) using Plan-View method. At this time, the buffer layer 4 is formed in a film with a thickness of 0.1 μm or less by an ion-milling machine or the like. The milled thickness is sufficiently smaller than an original layer thickness of the buffer layer 4, and the dislocation density value obtained by the TEM observation can be considered to represent the dislocation density in a predetermined plane of the buffer layer 4. It is noted that the predetermined plane is preferably located near an interface between the buffer layer 4 and the electron drift layer 5. Therefore, a test sample for the TEM observation is preferably taken from a portion near the interface between the buffer layer 4 and the electron drift layer 5.

Second, a half width of an X-ray rocking curve to the (102) plane of the buffer layer 4 is evaluated as a parameter of the amount of the dislocation in the buffer layer 4. A relationship between the half width, or a full width at half maximum, and a volume resistivity is obtained through an actual measurement.

Figure 3:
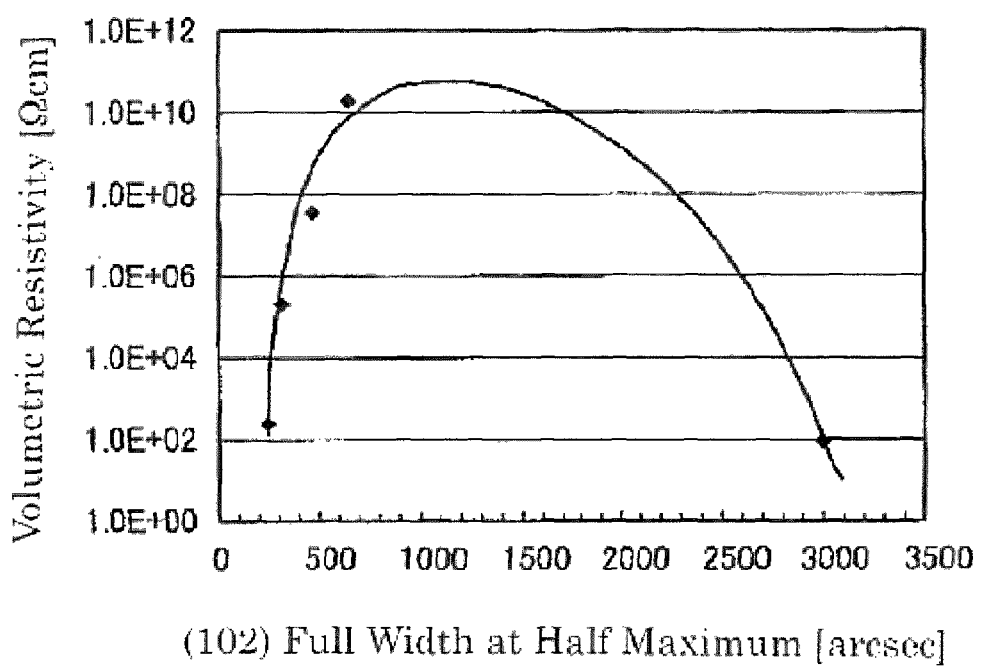
FIG. 3 is a graph showing a relationship between a (102) full width at a half maximum and the volume resistivity of the buffer layer.

FIG. 3 is a graph showing the result. As shown in FIG. 3, the volume resistivity of the buffer layer 4 has a maximal value with respect to a change in the full width at half maximum of the X-ray rocking curve to the (102) plane (hereinafter referred to as (102) full width at half maximum), and the buffer layer 4 has a higher resistance when the (102) full width at half maximum is adjusted so that the volume resistivity becomes maximal. The (102) full width at half maximum of the buffer layer 4 is preferably not less than 300 seconds and not greater than 2,700 seconds. When the (102) full width at half maximum of the buffer layer 4 is in the range, the volume resistivity is not less than about $1.0 \times 10^5$ cm.

Figures 1, 4:
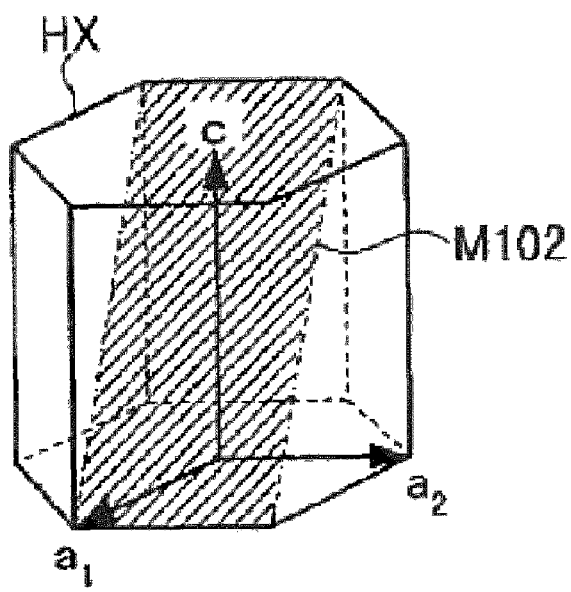
Figures 2, 4:
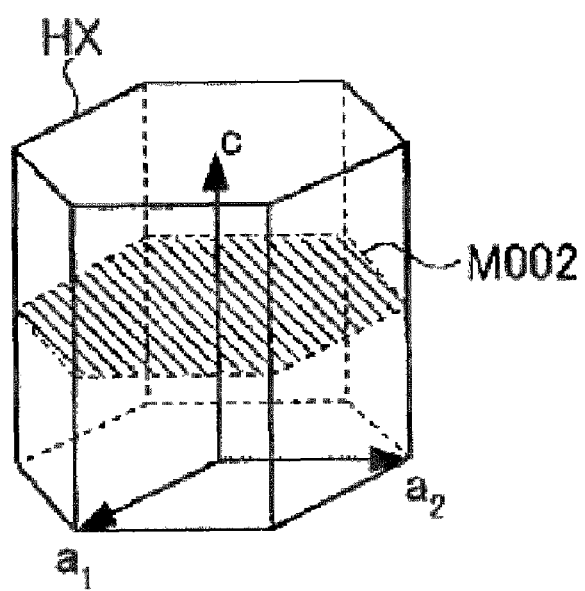

The (102) plane of the buffer layer 4 is a crystalline plane of Miller index of (102) in a hexagonal crystal, which is an unit lattice of GaN constituting the buffer layer 4, and corresponds to a crystalline plane M102 in the hexagonal crystal HX in FIG. 4-1. Furthermore, the X-ray rocking curve to the (102) plane is a rocking curve obtained by X-ray diffraction to the (102) plane. The value of the (102) full width at half maximum shown in FIG. 3 is a full width at half maximum of a rocking curve obtained by X-ray diffraction using K line (wavelength=1.54 Å) of Cu. The X-ray used to obtain a rocking curve is not limited to K line of Cu. Other X-ray, such as K line of Mo, may be used.

Figures 1, 5:
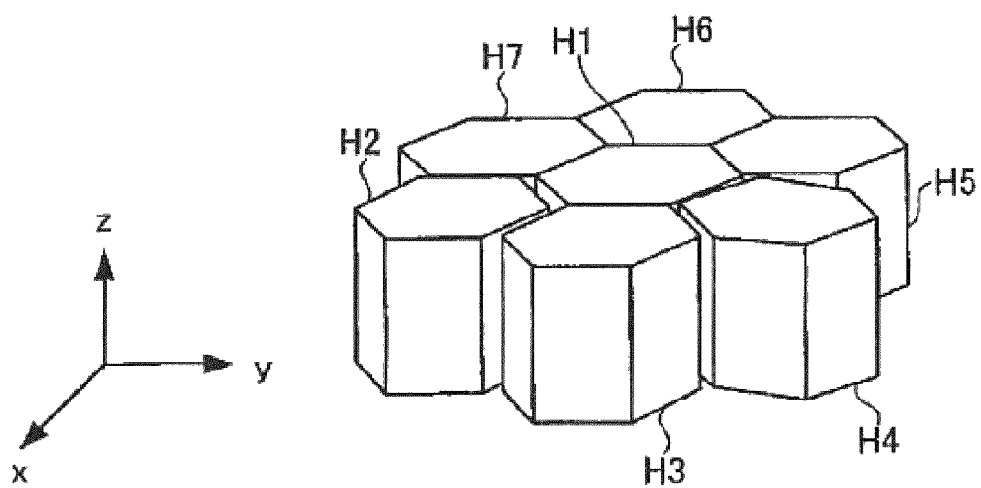
Figures 2, 5:
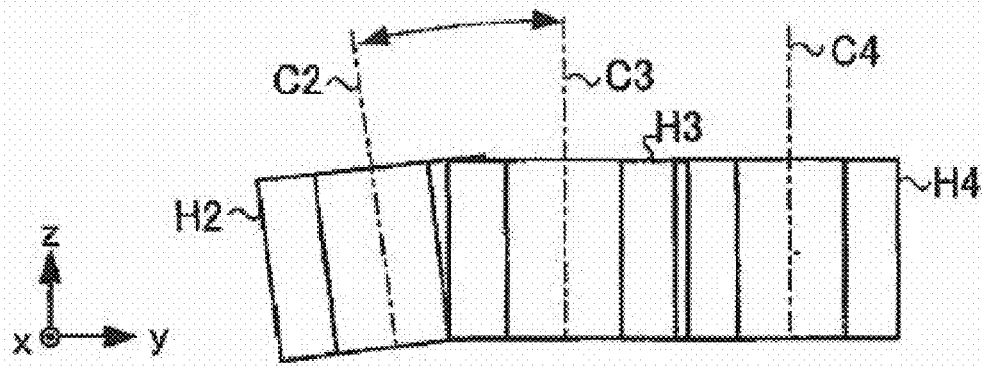
Figures 3, 5:
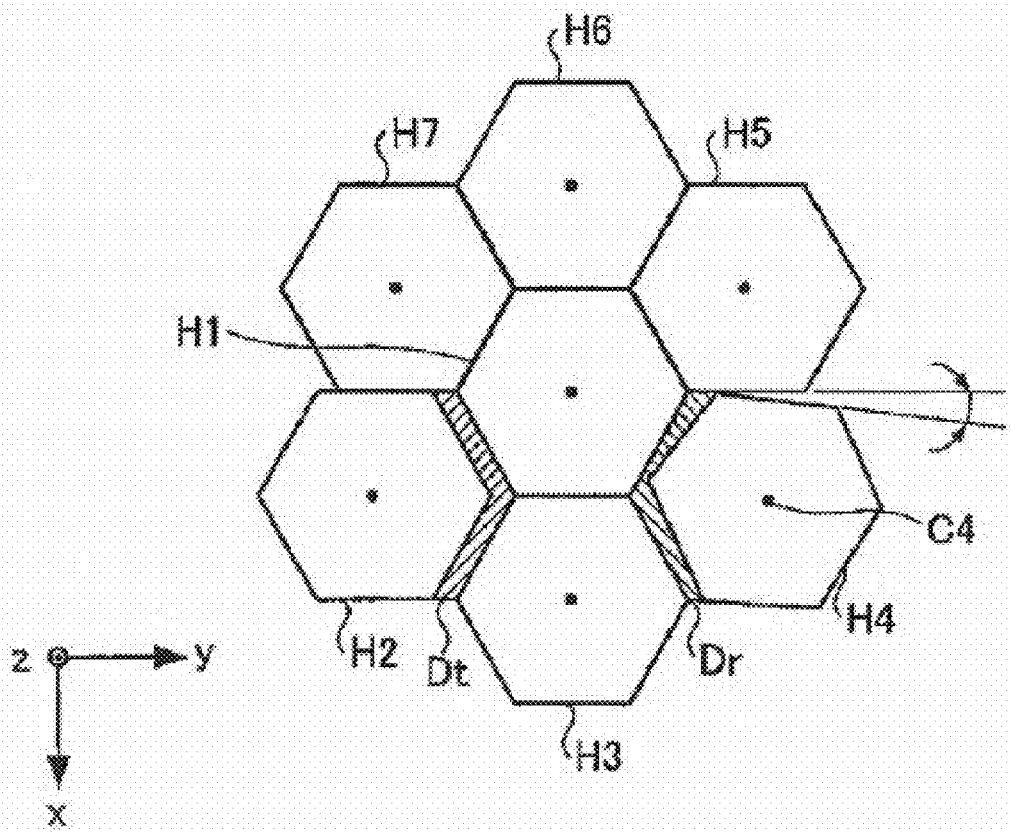

The threading dislocation formed in the buffer layer 4 is roughly classified into two kinds, i.e., a vertical threading dislocation (or edge dislocation) formed in the direction perpendicular to the in-plane direction, and an inclined threading dislocation (or screw dislocation) formed inclined with respect to the direction perpendicular to the in-plane direction. FIGS. 5-1 to 5-3 are explanatory diagrams schematically showing structures of the threading dislocations. FIG. 5-1 is a perspective view showing a part of the crystal structure of the buffer layer 4 of GaN. FIG. 5-2 is a front view showing the crystal structure of FIG. 5-1. FIG. 5-3 is a plan view showing the crystal structure of FIG. 5-1. In FIGS. 5-1 to 5-3, only one layer is shown out of the layers of hexagonal crystal system having actually a lamination structure in the thickness direction (in z-direction in the figures).

In the buffer layer 4 of GaN, ideally, a honeycomb structure is formed in which unit lattices of the hexagonal crystal are closely and regularly arranged with each other. However, in general, a shift is created in the lattice configuration due to a distortion caused by a stress in the crystal. The shift in the lattice arrangement is roughly classified into two kinds, i.e., a shift due to an inclination of the c-axis, which is a central axis of the hexagonal crystal, and a shift due to a rotation around the c-axis.

When the shift due to the inclination of the c-axis occurs, the crystal orientation shifts inclined with respect to the direction perpendicular to the in-plane direction. When the shift due to the rotation around the c-axis occurs, the crystal orientation shifts rotated around the direction perpendicular to the in-plane direction. When the shifts are transmitted in the in-plane direction of the hexagonal crystal, or in the thickness direction of the buffer layer 4, the inclined threading dislocation and the vertical threading dislocation are generated, respectively.

To be more concrete, as shown in FIGS. 5-1 to 5-3, for example, due to the inclination of the c-axis C2 in -y-direction with respect to the c-axis C3, an inclined shift Dt with respect to the z-axis, which is a direction perpendicular to the in-plane direction, is generated between the hexagonal crystal H2 and the hexagonal crystals H1, H3. Furthermore, due to the rotation around the c-axis C4, a shift Dr along a z-direction is generated between the hexagonal crystal H4 and the hexagonal crystals H1, H3. As the shift Dt is transmitted in the in-plane direction, the inclined threading dislocation is generated, and as the shift Dr is transmitted in the in-plane direction, the vertical threading dislocation is generated.

When an amount of the vertical threading dislocations becomes greater than an amount of the inclined threading dislocations, or a large part of the dislocations in the buffer layer 4 is formed of the vertical threading dislocations, the buffer layer 4 can have a higher resistance in the direction parallel to the in-plane direction. To this end, a relationship between the amount of the vertical threading dislocation and the volume resistivity is obtained.

Figures 6, 7:
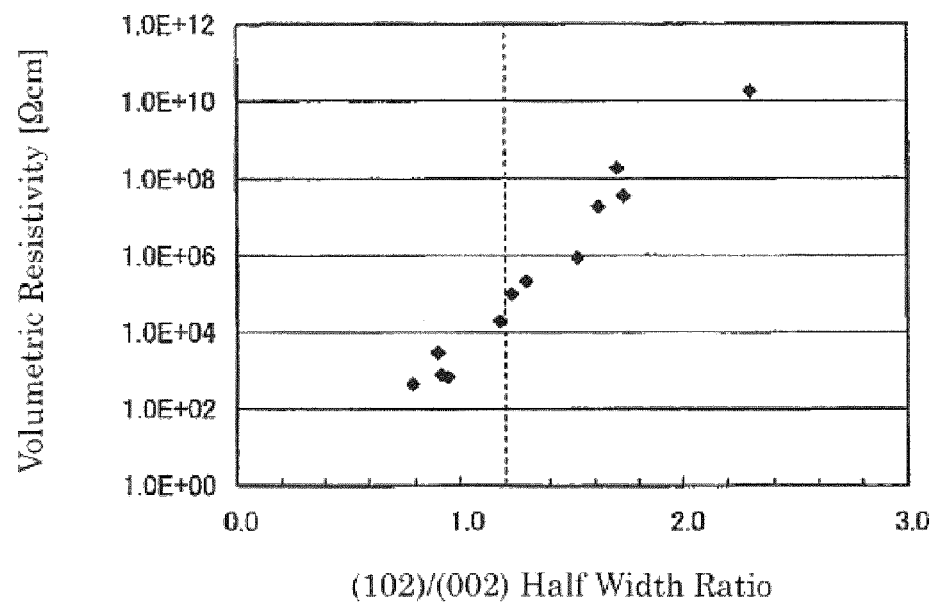
FIG. 6 is a graph showing a relationship between a (102)/(002) half width ratio and the volume resistivity of the buffer layer.
FIG. 7 is a diagram showing numerical data of the graph shown in the FIG. 6.

FIG. 6 and FIG. 7 are a graph and a table of numerical data showing results of the actual measurement of the relationship between (102)/(002) half width ratio (a ratio of the half width of the X-ray rocking curve to the (102) plane of the buffer layer 4 to the half width of the X-ray rocking curve to the (002) plane of the buffer layer 4 ) and the volume resistivity, using the (102)/(002) half width ratio as the parameter of the amount of the vertical threading dislocation in the buffer layer 4. From the results shown in these figures, the volume resistivity of the buffer layer 4 can be increased to a high resistance of not less than about $1.0 \times 10^5$ Ωcm by setting the (102)/(002) half width ratio to not less than 1.2.

Note that the (002) plane of the buffer layer 4, like the (102) plane, is a crystalline plane of Miller index of (002) in the hexagonal crystal of GaN, and corresponds to the crystalline plane M002 of the hexagonal crystal HX shown in FIG. 4-2. A half width of the X-ray rocking curve to the (002) plane (hereinafter referred to as (002) half width) is a rocking curve obtained by X-ray diffraction to the (002) plane parallel to the in-plane direction, and is an index reflecting an amount of a crystalline plane inclined with respect to the in-plane direction, namely an amount of the inclined threading dislocation.

Further, a half width of the X-ray rocking curve to the (102) plane inclined with respect to the in-plane direction (hereinafter referred to as (102) half width) is considered to an index reflecting an amount of the crystalline plane inclined with respect to the in-plane direction and the crystalline plane perpendicular to the in-plane direction, namely an amount of the threading dislocation of both the inclined threading dislocation and vertical threading dislocation. Thus, the (102)/(002) half width ratio, the (102) half width divided by the (002) half width, can be an index indicating the amount of the vertical threading dislocation.

As shown in FIG. 6 and FIG. 7, the dislocation density of the buffer layer 4 is not less than $2.0 \times 10^8$ cm$^{-2}$ and not greater than $7.0 \times 10^{10}$ cm$^{-2}$, as found from the results of FIG. 2, and the (102) full width at half maximum is not less than 300 seconds and not greater than 2,700 seconds, as found from the results of FIG. 3. When the dislocation density and the (102) full width at half maximum of the buffer layer 5 are not within the ranges, it is difficult to make the volume resistivity of the buffer layer 4 not less than $1.0 \times 10^5$ Ωcm even though the (102)/(002) half width ratio is not less than 1.2.

On the other hand, even if the dislocation density of the buffer layer 4 is not less than $2.0 \times 10^8$ cm$^{-2}$ and not greater than $7.0 \times 10^{10}$ cm$^{-2}$, and if the (102) half width is not less than 300 seconds and not greater than 2700 seconds, it is difficult to make the volume resistivity of the buffer layer 4 not less than $1.0 \times 10^5$ Ωcm when the (102)/(002) half width ratio is less than 1.2. For example, when the dislocation density is $1.0 \times 10^9$ cm$^{-2}$ and the (102)/(002) half width ratio is 2.304 and 1.067, the volume resistivity becomes $1.81 \times 10^{10}$ Ωcm and $4.53 \times 10^2$ Ωcm, respectively.

Figure 8:
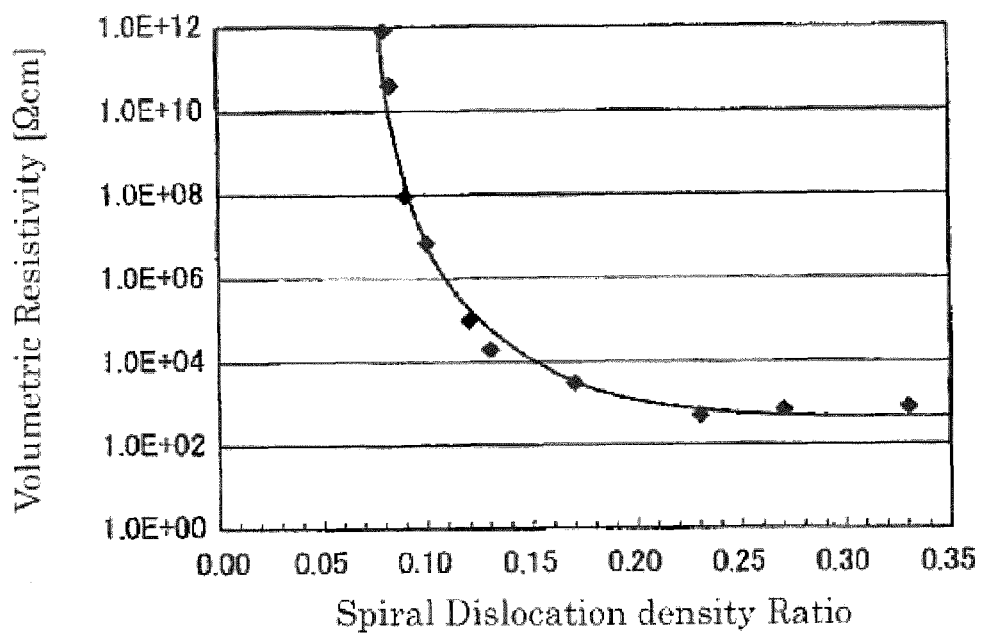
FIG. 8 is a graph showing a relationship between a screw dislocation density ratio and the volume resistivity of the buffer layer.

A ratio of the screw dislocation density of the buffer layer 4 to the total dislocation density is used as a parameter of the amount of the vertical threading dislocation of the buffer layer 4, and a relationship between the ratio of the screw dislocation density and the volume resistivity is obtained through an actual measurement. FIG. 8 is a graph showing the results. As shown in FIG. 8, the volume resistivity of the buffer layer 4 has a resistance not less than $1.0 \times 10^5$ Ωcm when the ratio of the screw dislocation density is not greater than 0.12.

The total dislocation density is a dislocation density measured by TEM observation using the Plan-View method described abov-, and indicates a dislocation density of the aggregation of the vertical threading dislocation and the inclined threading dislocation, that is, the edge dislocation and the screw dislocation. Furthermore, the screw dislocation density is a dislocation density measured by TEM observation under a [0002]-exited dark field method. A screw dislocation density ratio is calculated as a ratio of the total dislocation density and the screw dislocation density, and is considered as the indicator of the amount of the vertical threading dislocation.

The edge dislocation density can be measures by TEM observation under a [11-20]-exited dark field method. An edge dislocation density ratio calculated as a ratio of the edge dislocation density to the total dislocation density may be used as the indicator of the amount of the vertical threading dislocation density. In addition, a screw/edge dislocation density ratio calculated as a ratio of the screw dislocation density to the edge dislocation density may be used as the indicator. The buffer layer 4 has a high breakdown voltage when the screw/edge dislocation density ratio is not greater than 0.20.

As shown in FIG. 8, the dislocation density of the buffer layer 4 is not less than $2.0 \times 10^8$ cm$^{-2}$ and not greater than $7.0 \times 10^{10}$ cm$^{-2}$, as shown in FIG. 1, and the (102) full width at half maximum is not less than 300 seconds and not greater than 2,700 seconds, as shown in FIG. 2. In addition, the (102)/(002) half width ratio is not less than 1.2 as shown in FIG. 6 and FIG. 7.

As described above, the buffer layer 4 of the HEMT 1 according to the first embodiment has the dislocation density so that the volume resistivity is maximal in the relationship between the dislocation density and the volume resistivity. More specifically, the buffer layer 4 has the dislocation density not less than $2.0 \times 10$ cm$^{-2}$ and not greater than $7.0 \times 10$ cm$^{-2}$.

Furthermore, the buffer layer 4 has the half width of the X-ray rocking curve to the (102) plane so that the volume resistivity is maximal in the relationship between the half width and the volume resistivity. More specifically, the buffer layer 4 has the (102) full width at half maximum of not less than 300 seconds and not greater than 2,700 seconds. Furthermore, the buffer layer 4 has the (102)/(002) half width ratio not less than 1.2 and the screw dislocation density ratio not greater than 0.12. As a result, the volume resistivity of the buffer layer 4 is not less than $1.0 \times 10^5$ Ωcm.

Figure 9:
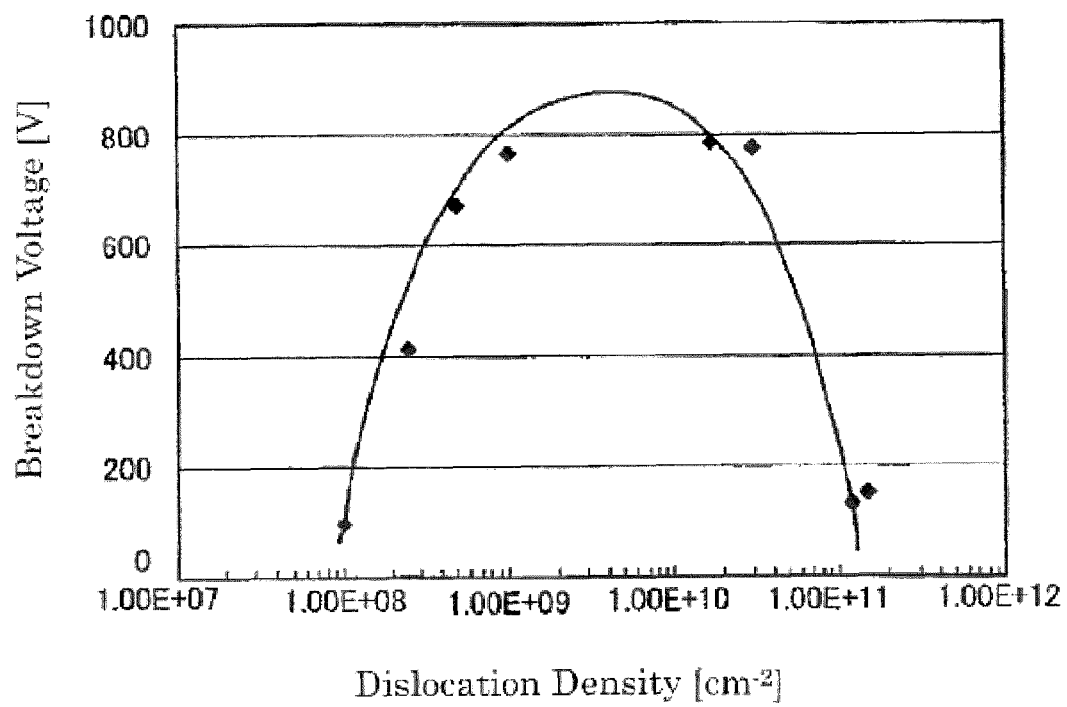
FIG. 9 is a graph showing a relationship between a dislocation density and a breakdown voltage of the buffer layer.
Figure 10:
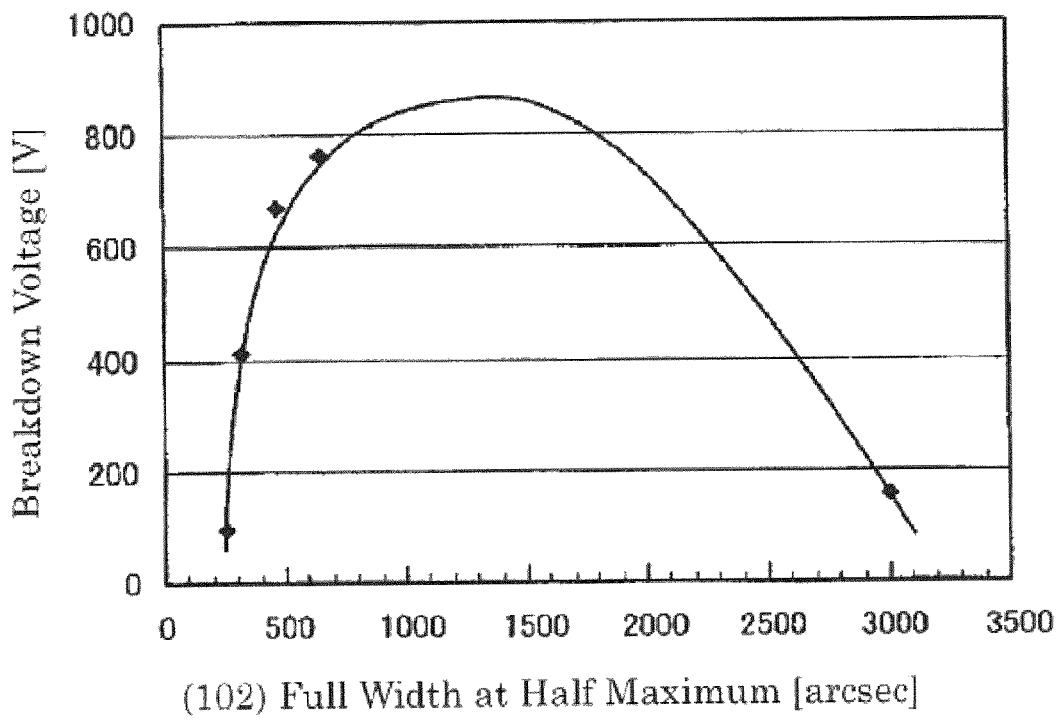
FIG. 10 is a graph showing a relationship between a (102) full width at a half maximum and the breakdown voltage of the buffer layer.
Figure 11:
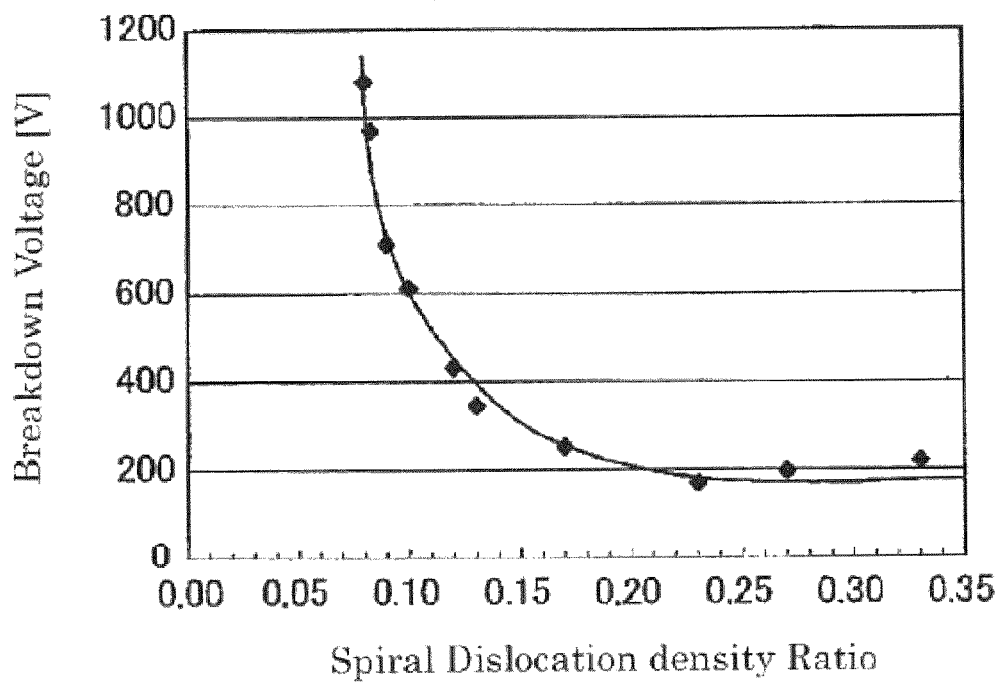
FIG. 11 is a graph showing a relationship between a screw dislocation ratio and the breakdown voltage of the buffer layer.

The buffer layer 4 has the high breakdown voltage as well as the high resistance. FIG. 9 and FIG. 10 are graphs showing the relationship between the dislocation density of the buffer layer 4 and the breakdown voltage and the relationship between the (102) full width at half maximum of the buffer layer 4 and the breakdown voltage obtained through an actual measurement, respectively. Furthermore, FIG. 11 is a graph showing the relationship between the screw dislocation density ratio and the breakdown voltage obtained through an actual measurement.

As shown in FIG. 9, the breakdown voltage is not less than about 400 V when the dislocation density of the buffer layer 4 is not less than $2.0 \times 10$ cm$^{-2}$ and not greater than $7.0 \times 10^{10}$ cm$^{-2}$. As shown in FIG. 10, the breakdown voltage is not less than about 400 V when the (102) full width at half maximum is not less than 300 seconds and not greater than 2,700 seconds. As shown in FIG. 11, the breakdown voltage is not less than about 400 V when the screw dislocation density ratio is not greater than 0.12. Note that the breakdown voltage shown in FIGS. 9-11 is a voltage at which the HEMT 1 is broken when the voltage is applied between the source electrode 7S and the drain electrode 7D in a pinch-off state.

In general, the breakdown voltage is required according to a supply voltage. For example, for the AC power supply of 100 V and 120 V, the breakdown voltage of 310 V and 375 V are required respectively, taking into account a voltage variation of up to 1.1 times the voltage. The buffer layer 4 with the breakdown voltage of 400 V is considered to be sufficient.

Sometimes, the breakdown voltage of 750 V is required for the supply voltage of 230 V, for example. When such a higher breakdown voltage is required, to have a higher breakdown voltage, it is preferable that the buffer layer 4 has the dislocation density value so that the breakdown voltage is maximal in the relationship between the dislocation density and the breakdown voltage. Specifically, the dislocation density is preferably not less than $1.0 \times 10^9$ cm$^{-2}$ and not greater than $2.0 \times 10^{10}$ cm$^{-2}$. Furthermore, it is preferable that the buffer layer 4 has the (102) full width at half maximum value so that the breakdown voltage is maximal in the relationship between the (102) full width at half maximum and the breakdown voltage. Specifically, the (102) full width at half maximum is preferably not less than 800 seconds and not greater than 1,800 seconds. Furthermore, it is preferable that the buffer layer 4 has the screw dislocation density ratio not greater than 0.08. Accordingly, the buffer layer 4 have the breakdown voltage of not less than about 800 V.

A manufacturing process of the HEMT 1 is explained below. The HEMT 1 is formed by depositing a nitride-based compound semiconductor layer on the substrate 2 by MOCVD (Metal Organic Chemical Vapor Deposition) method. Specifically, trimethylgallium (TMG) and ammonia ($NH_3$), which are materials for a compound semiconductor, are introduced into a MOCVD apparatus in which the substrate 2 such as a sapphire substrate is placed with a flow rate of 14 μmol/min and 12 l/min, respectively, at a growth temperature of 580° C. to 620° C. to epitaxially grow the low temperature buffer layer 3 of GaN with a thickness of 40 nm on the substrate 2. Then, the buffer layer 4 of GaN with a thickness of 3,000 nm is epitaxially grown on the low temperature buffer layer 3 by introducing TMG and $NH_3$ with a flow rate of 58 μmol/min and 12 l/min, respectively, at a growth temperature of 1,050° C.

Subsequently, the electron drift layer 5 of GaN with a thickness of 50 nm is epitaxially grown on the buffer layer 4 by introducing TMG and $NH_3$ with a flow rate of 19 μmol/min and 12 l/min, respectively, at a growth temperature of 1,050° C. Thereafter, electron supplying layer 6 of $Al_{0.3}Ga_{0.7}N$ with a thickness of 30 nm is epitaxially grown on the electron drift layer 5 by introducing trimethylaluminum (TMA), TMG and $NH_3$ with a flow rate of 100 μmol/min, 19 μmol/min, and 12 l/min, respectively, at a growth temperature of 1,050° C. In introducing TMA, TMG, and $NH_3$, 100% hydrogen is used as a carrier gas.

Thereafter, a mask of $SiO_2$ film is formed on the electron supplying layer 6 by patterning using photolithography. Openings corresponding to shapes of the source electrode 7S and the drain electrode 7D are formed in regions at which the source electrode 7S and the drain electrode 7D are formed. Ti, Al, and Au are evaporated in this order on the openings to form the source electrode 7S and the drain electrode 7D. Then, the mask on the electron supplying layer 6 is removed. A mask of $SiO_2$ is re-deposited on the electron supplying layer 6, and an opening corresponding to a shape of the gate electrode 7G is formed in the region at which the gate electrode 7G is formed. Pt and Au are evaporated in this order in the opening to form the gate electrode 7G.

Figure 12:
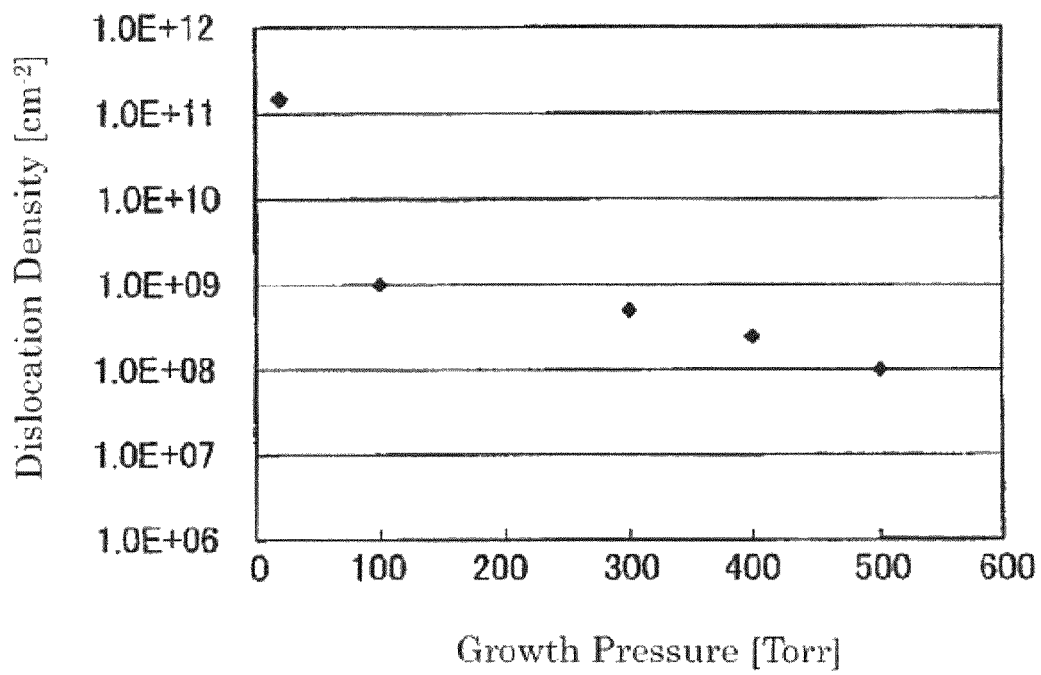
FIG. 12 is a graph showing a relationship between a growth pressure and the dislocation density of the buffer layer.
Figure 13:
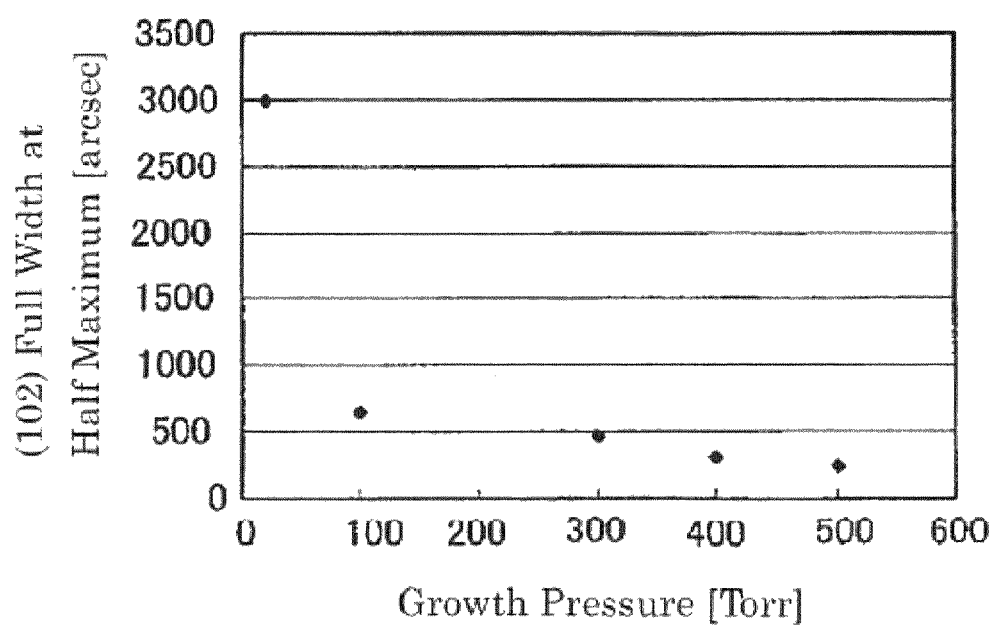
FIG. 13 is a graph showing a relationship between the growth pressure and the (102) full width at the half maximum of the buffer layer.

In the step of forming the buffer layer 4 in the manufacturing process of the HEMT 1, a growth pressure is controlled such that the dislocation density and the (102) full width at half maximum are within the desired ranges. FIG. 12 and FIG. 13 are graphs showing a relationship between the growth pressure and the dislocation density and a relationship between the growth pressure and the (102) full width at half maximum obtained through an actual measurement, respectively. As shown in FIG. 12 and FIG. 13, the dislocation density and the (102) full width at half maximum increase when the growth pressure of the buffer layer 4 decreases. In the step of forming the buffer layer 4, the dislocation density and the (102) full width at half maximum of the buffer layer 4 are controlled through the growth pressure. The growth pressure of the buffer layer 4 is preferably not greater than 100 Torr.

Furthermore, the (002) half width of the buffer layer 4 increases when the growth temperature of the low temperature buffer layer 3 increases. Specifically, the (002) half width increases from 283 seconds to 564 seconds when the growth temperature of the low temperature buffer layer 3 is changed from 550° C. to 600° C. In the manufacturing process of the HEMT 1, the (102)/(002) half width ratio is controlled through the growth temperature of the low temperature buffer layer 3.

Figure 14:
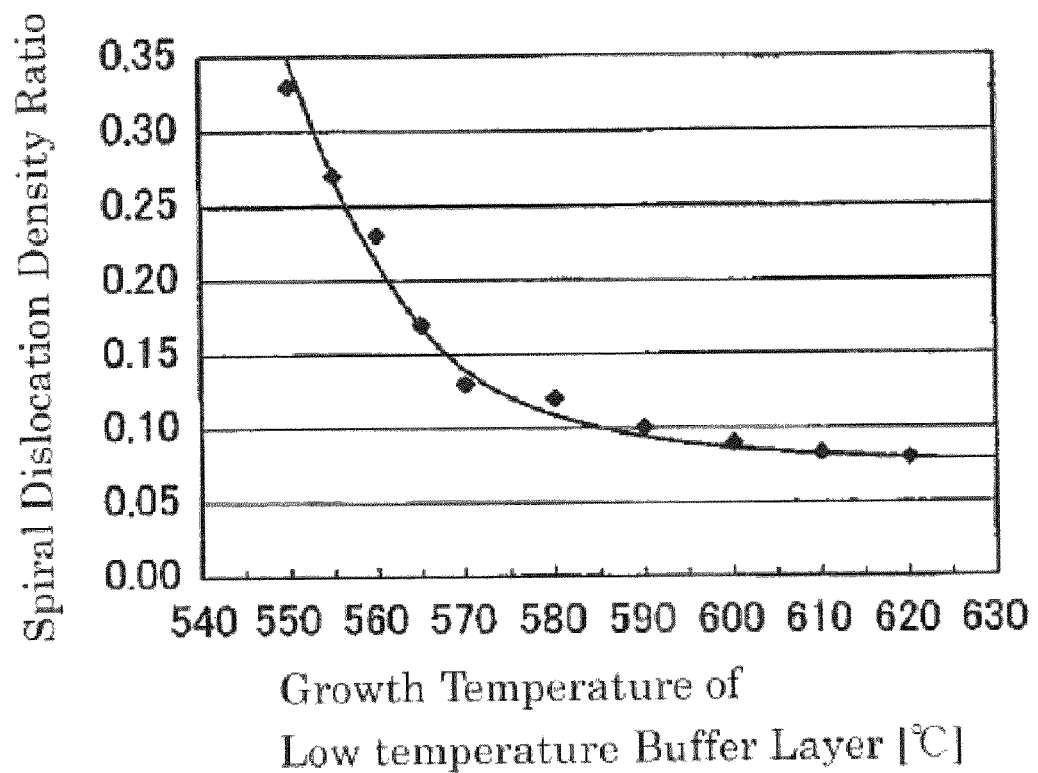
FIG. 14 is a graph showing a relationship between a growth temperature of a low temperature buffer layer and the screw dislocation density ratio of the buffer layer.
Figure 15:
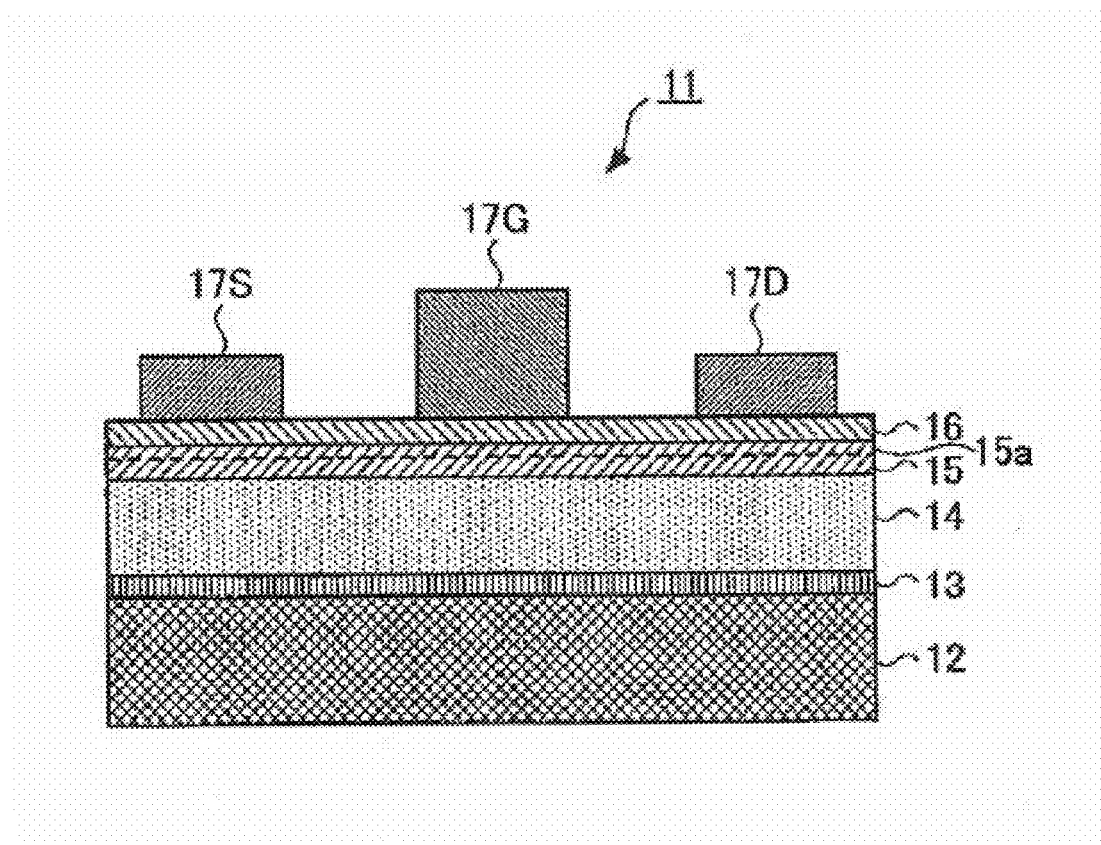
FIG. 15 is a cross sectional view showing a conventional semiconductor device.

FIG. 14 shows a relationship between the growth temperature of the low temperature buffer layer 3 and the screw dislocation density ratio of the buffer layer 4 obtained through an actual measurement. As shown in FIG. 14, the screw dislocation density ratio is not greater than 0.12 when the low temperature buffer layer 3 is grown at a growth temperature of not less than 580° C. and not greater than 620° C.

As explained above, in the HEMT 1 according to the first embodiment, the dislocation density of the buffer layer 4 is set so that the volume resistivity is maximal over the dislocation density. Specifically, the dislocation density of the buffer layer 4 is not less than $2.0 \times 10^8$ $cm^{-2}$ and not greater than $7.0 \times 10^{10}$ $cm^{-2}$. Furthermore, the half width of the X-ray rocking curve to the (102) plane of the buffer layer 4 is set so that the volume resistivity is maximal over the half width. Specifically, the (102) half width 4 is less than 300 seconds and not greater than 2,700 seconds. Furthermore, the (102)/(002) half width ratio is not less than 1.2, and the screw dislocation density ratio is not greater than 0.12. Accordingly, the buffer layer 4 has the high resistance without deteriorating the current collapse, and the leak current in the buffer layer 4 is reduced. In addition, it is possible to obtain a higher resistance and a higher breakdown voltage.

Note that, in order to prevent the current collapse, it is preferable that an impurity concentration of each compound semiconductor layer is as small as possible, preferably less than a detection limit of SIMS (Secondary Ion Mass Spectroscopy).

In the first embodiment, the HEMT 1, which is a type of FET, is explained as the semiconductor device. The present invention is limited to the HEMT 1, and can be applied to a variety of FETs such as MISFET (Metal Insulator Semiconductor FET), MOSFET (Metal Oxide Semiconductor FET), MESFET (Metal Semiconductor FET) or the like.

Moreover, the present invention can be applied to, other than the FET, a various kind of diodes such as Schottky diode. The diode includes a diode formed with a cathode electrode and an anode electrode in place of the source electrode 7S, the drain electrode 7D, and the gate electrode 7G of the HEMT 1.

In the first embodiment, the semiconductor device according to the present invention has the compound semiconductor layer formed of the nitride-based compound semiconductor, especially the GaN-based compound semiconductor. The present invention is not limited to the nitride-based or GaN-based, and can be applied to a semiconductor device having a compound semiconductor layer formed of other compound semiconductor.

Furthermore, in the first embodiment, the buffer layer 4 is formed of GaN, and may be formed of AlGaN, InGaN, etc. The substrate 2 is a sapphire substrate or the like, and may be an Si substrate or SiC substrate.

Second Embodiment

Figure 16:
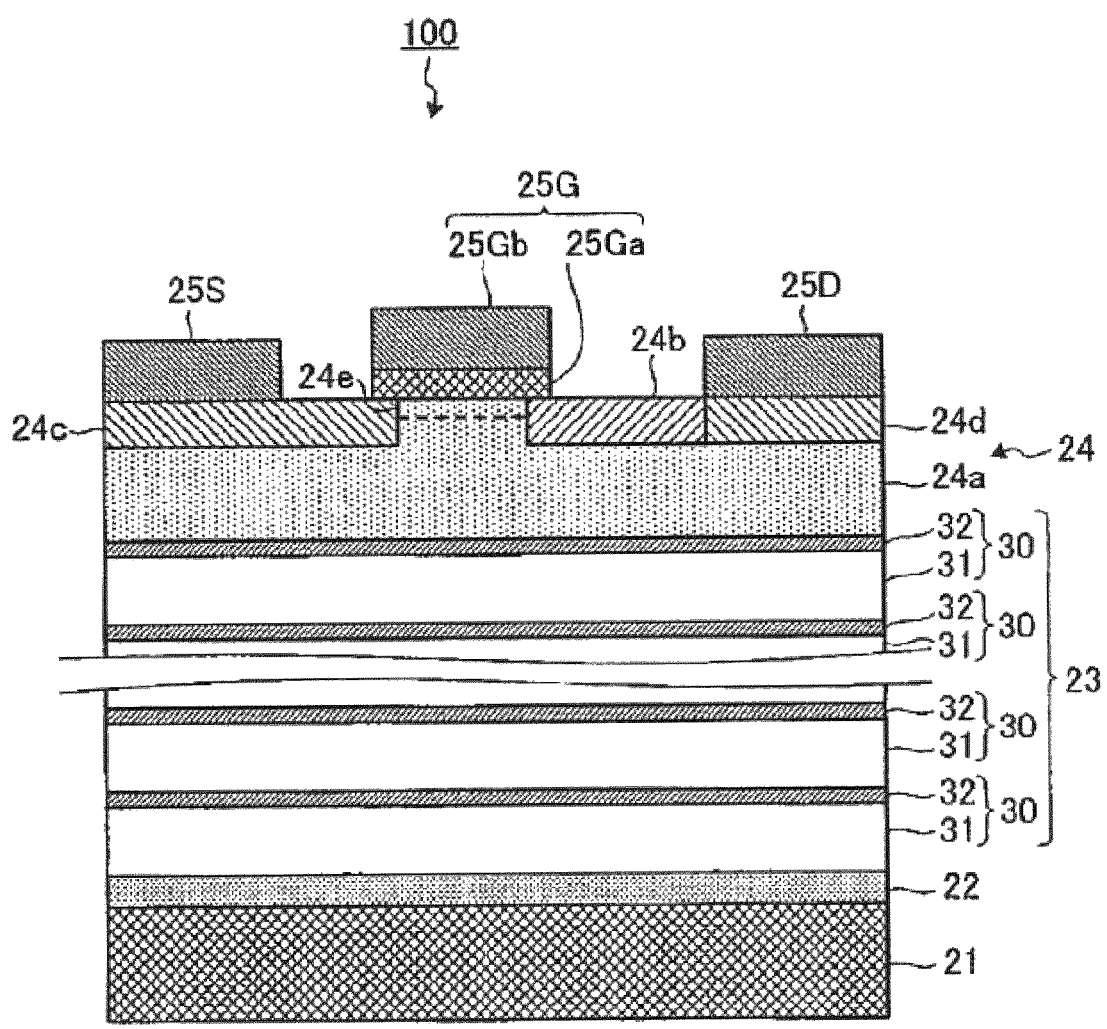
FIG. 16 is a cross sectional view showing a semiconductor device according to a second embodiment of the present invention.

FIG. 16 is a cross sectional view showing a field effect transistor as a semiconductor device according to the second embodiment of the present invention. As shown in FIG. 16, the field effect transistor 100 is formed by sequentially laminating buffer layers 22, 23, which are formed of nitride-based compound semiconductor, and a semiconductor active layer 24 in this order on a substrate 21 of, for example, Si, sapphire, SiC or ZnO. A source electrode 25S, a drain electrode 25D and an insulating gate 25G are formed on the semiconductor active layer 24.

The buffer layer 22 is formed of AlN and a thickness thereof is 40 nm. The buffer layer 23 is formed by laminating a plurality of composite layers 30, each including a first layer 31 formed of a nitride-based compound semiconductor and a second layer 32 formed of a nitride-based compound semiconductor having a larger Al composition than the first layer 31. The second layer 32 is formed on the first layer 31. Specifically, the first layer 31 is formed of GaN, and the second layer 32 is formed of AlN. Thicknesses of the first layer 31 and the second layer 32 are 200 nm and 20 nm, respectively. Eight of the composite layers 30 are laminated.

Note that the semiconductor materials that form the buffer layer 22, the first layer 31 and the second layer 32 are not restricted to GaN or AlN, and may be a semiconductor material including other elements. Furthermore, the number of the composite layers 30 is not restricted to eight, and may be an arbitrary number not less than one, preferably not less than four.

The semiconductor active layer 24 includes a p-type semiconductor layer 24a of p-GaN as a p-type semiconductor, a resurf layer 24b of n--GaN as a n-type semiconductor, and contact layers 24c, 24d of n+-GaN. The p-type semiconductor layer 24a is doped with Mg as a p-type impurity, and an Mg concentration as an impurity concentration is $5\times10^{16}$ cm$^{-3}$. The resurf layer 24b and the contact layers 24c, 24d are doped with Si as an n-type impurity, and Si concentrations as an impurity concentration are $5\times10^{17}$ cm$^{-3}$ and $5\times10^{20}$ cm$^{-3}$, respectively.

The insulating gate 25G is formed by sequentially laminating the gate insulating film 25Ga and the gate electrode 25Gb in this order on the p-type semiconductor layer 24a. An oxide film having a sufficient electric breakdown field strength, such as $SiO_2$ or $Al_2O_3$ or the like, is used for the gate insulating film 25Ga. A thickness thereof is, in the case of $SiO_2$, set to 50 to 100 nm. Both ends of the gate insulating film 25Ga are jutted out on the contact layer 24c and the resurf layer 24b in a direction of a drain current (in the lateral direction of FIG. 16). The gate electrode 25Gb is formed of polysilicon or metal film such as Ni/Au or WSi. The source electrode 25S and the drain electrode 25D are formed on the contact layers 24c, 24d, respectively, and formed of a metal film which can be in ohmic contact with the contact layers 24c, 24d, such as Ti/Al or Ti/AlSi/Mo or the like.

In the field effect transistor 100, when the gate electrode 25Gb is applied with a positive voltage above a predetermined value, an inverted layer 24e is generated at a topmost part of the p-type semiconductor layer 24a in the vicinity of an interface between the gate insulating film 25Ga and the p-type semiconductor layer 24a. The inverted layer 24e acts as a channel for electrically connecting the contact layer 24c, the resurf layer 24b and the contact layer 24d, so that a drain current flows between the source electrode 25S and the drain electrode 25D. By changing a thickness of a depletion layer (not shown) generated beneath the gate insulating film 25Ga according to the voltage applied to the gate electrode 25Gb, the drain current is switched between ON/OFF, namely, the field effect transistor 100 is switched between ON/OFF.

The buffer layer 23 is explained in detail below. The buffer layer 23 has a high resistance so that a leak current therein is reduced, as in the first embodiment. That is, the buffer layer 23 has a dislocation density so that the volume resistivity is maximal in the relationship between the dislocation density and the volume resistivity. Specifically, the buffer layer 23 has the dislocation density of not less than $2.0\times10^8$ cm$^{-2}$ and not greater than $7.0\times10^{10}$ cm$^{-2}$.

Furthermore, the buffer layer 23 has a half width of the X-ray rocking curve to the (102) plane so that the volume resistivity is maximal in the relationship between the half width and the volume resistivity. Specifically, the buffer layer 23 has the (102) full width at half maximum of not less than 300 seconds and not greater than 2,700 seconds. Still further, the buffer layer 23 has a (102)/(002) half width ratio of not less than 1.2 and a screw dislocation density ratio of not greater than 0.12. The buffer layer 23 has the same characteristics as those shown in FIGS. 2, 3, 6, 7, and 8 for the buffer layer 4.

Figure 17:
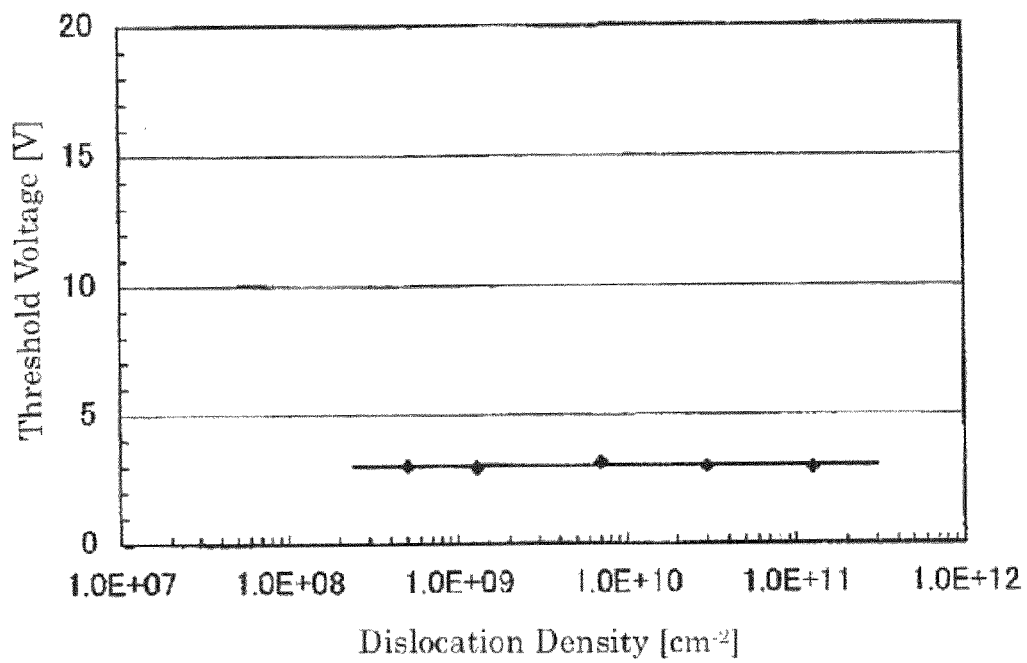
FIG. 17 is a graph showing a relationship of a threshold voltage relative to a dislocation density of a buffer layer.

FIG. 17 is a graph showing measurement results of a threshold voltage of the field effect transistor 100 versus the dislocation density of the buffer layer 23. As shown in FIG. 17, in the field effect transistor 100, the threshold voltage can be maintained constant irrespective of the dislocation density of the buffer layer 23. Furthermore, by setting the Mg concentration in the buffer layer 23 at $5\times10^{16}$ cm$^{-3}$, a threshold voltage of about 3V can be obtained. Therefore, the Mg concentration in the buffer layer 23 is set at $5\times10^{16}$ cm$^{-3}$.

In the field effect transistor 100, it is possible to make the buffer layer 23 have the higher resistance without increasing the threshold voltage. Specifically, the volume resistivity of the buffer layer 23 is set to a high resistance of $1.0\times10^5$ Ωcm. Furthermore, the threshold voltage of about 3 V is obtained, which in general is considered to be preferable for controlling a semiconductor device such as a field effect transistor or the like.

Figure 18:
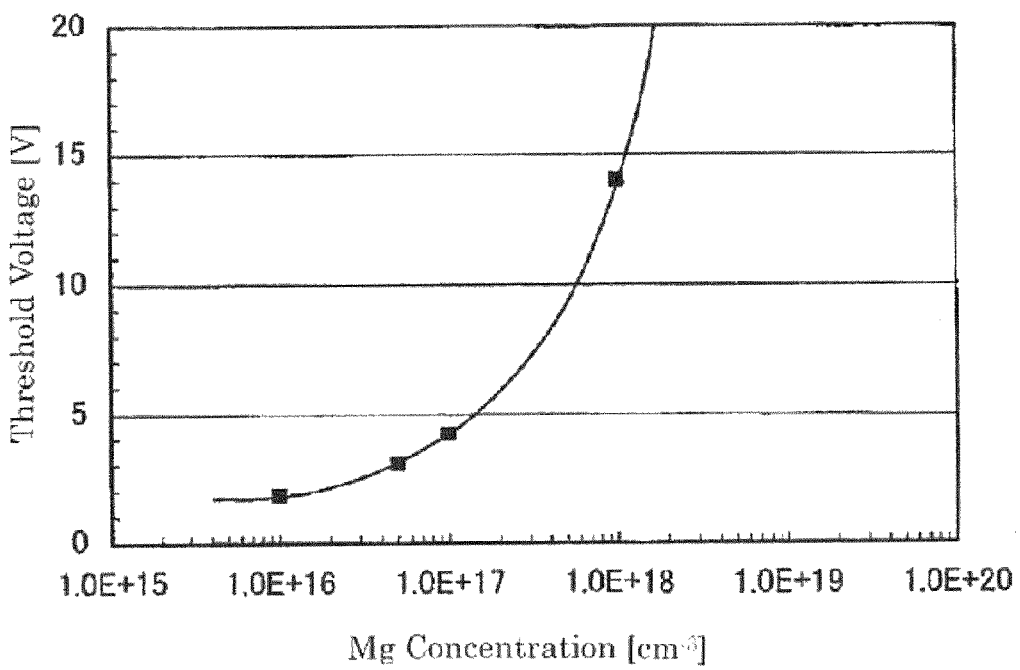
FIG. 18 is a graph showing a relationship of the threshold voltage relative to an Mg concentration of the buffer layer.

In the conventional field effect transistor described in the patent document 1, when doping Zn or Mg in the buffer layer in order to realize a higher resistance, the threshold voltage increases with the increase in the impurity concentration of Zn or Mg in the buffer layer, as shown in FIG. 18. In the patent document 1, although it is described that the impurity concentration is preferably not less than $1\times10^{18}$ cm$^{-3}$, the threshold voltage is at least not less than 10 V, which is far above the preferable value of 3 V, as shown in FIG. 18. That is, in the conventional field effect transistor, it is difficult to simultaneously realize a high resistance of the buffer layer and a desirable threshold voltage.

On the other hand, in the field effect transistor 100, it is possible to simultaneously realize a high resistance of the buffer layer 23 and a desirable threshold voltage by having the dislocations in the buffer layer 23.

Note that the desirable value of the threshold voltage of the field effect transistor 100 is not limited to 3 V, and may preferably be set in the range of 3±1 V depending on the application or the like of the device. In the field effect transistor 100, the Mg concentration in the buffer layer 23 is preferably set within the range of not less than $1\times10^{16}$ cm$^{-3}$ and not greater than $1\times10^{17}$ cm$^{-3}$.

Furthermore, in the field effect transistor 100, similar to the HEMT 1 in the first embodiment, it is possible to obtain a high breakdown voltage, accompanied by a high resistance of the buffer layer 23. That is, in the field effect transistor 100, it is possible to obtain characteristics comparable to those shown in FIGS. 9 to 11.

Next, a manufacturing process of the field effect transistor 100 is explained. The field effect transistor 100 is formed by sequentially laminating a variety of nitride-based compound semiconductors on the substrate 21 by using, for example, MOCVD (Metal Organic Chemical Vapor Deposition) method. Specifically, the substrate 21 is introduced into an MOCVD apparatus, and trimethylaluminum (TMA) and ammonia ($NH_3$), which are materials for the compound semiconductor, are introduced onto the substrate 21 with flow rates of 19 μmol/min and 12 liter/min, respectively, to grow the buffer layer 22 of AlN on the substrate 21 to a thickness of 40 nm.

Then, trimethylgallium (TMG) and $NH_3$ are introduced onto the buffer layer 22 with flow rates of 58 μmol/min and 12 liter/min, respectively to epitaxially grow the first layer 31 of GaN on the buffer layer 22. Thereafter, TMA and $NH_3$ are introduced onto the first layer 31 with flow rates of 19 μmol/min and 12 liter/min, respectively, to epitaxially grow the second layer 32 of AlN on the first layer 31. The first layer 31 and the second layer 32 are repeatedly formed 8 times, for example, so that the buffer layer 23 composed of the composite layers 30 is formed. The thicknesses of the first layer 31 and the second layer 32 are 200 nm and 20 nm, respectively.

In forming the buffer layer 23, a growth pressure is controlled so that the dislocation density and the (102) full width at half maximum are within the desired range. The similar characteristics to those shown in FIG. 12 and FIG. 13 are obtained for the buffer layer 23, and the dislocation density and the (102) full width at half maximum increase by decreasing the growth pressure of the buffer layer 23. Note that the growth pressure of the buffer layer 23 is preferably not greater than 100 Torr.

Then, TMG and $NH_3$ are introduced onto the buffer layer 23 with flow rates of 58 μmol/min and 12 liter/min, respectively, while simultaneously introducing $Cp_2Mg$ (bis-cyclopentadienyl Mg) to epitaxially grow a p-GaN layer to be the semiconductor active layer 24 on the buffer layer 23. A flow rate of $Cp_2Mg$ is controlled to adjust the Mg concentration to $5 \times 10^{16}$ cm$^{-3}$.

In the forming step of each of the layers mentioned so far, the growth temperature is set to 1,050° C. Furthermore, 100% hydrogen is used as a carrier gas to introduce TMA, TMG, and $NH_3$.

Thereafter, Si is added to the p-GaN layer formed on the buffer layer 23 by ion implantation. An implanting depth of Si is set to 300±100 nm or so, and Si concentrations are set to $1 \times 10^{17}$ cm$^{-3}$ in the region corresponding to the resurf layer 24b, and $1 \times 10^{20}$ cm$^{-3}$ in the regions corresponding to the contact layers 24c, 24d. Thereafter, activation annealing is conducted at 1,200° C. for 1 minute. Thus, the semiconductor active layer 24 including the p-type semiconductor layer 24a, the resurf layer 24b, and the contact layers 24c, 24d formed on the buffer layer 23 is formed.

Then, an oxide film of $SiO_2$ or $Al_2O_3$, for example, is deposited on the semiconductor active layer 24 by PCVD (Plasma Chemical Vapor Deposition) method to have a thickness of 50-100 nm, and the gate insulating film 25Ga is formed by photolithography and etching using buffered fluoric acid. Thereafter, a metal film of Ti/Al or Ti/AlSi/Mo is formed on the contact layers 24c, 24d by lift-off method, which thereafter is thermally treated at 600° C. for 10 minutes to form ohmic electrodes of the source electrode 25S and the drain electrodes 25D. Furthermore, a metal film of Ni/Au or WSi is formed on the gate insulating film 25Ga by lift-off method, to form the gate electrode 25Gb.

As described above, in the field effect transistor 100 according to the second embodiment, the dislocation density of the buffer layer 23 is set so that the volume resistivity is maximal over the dislocation density. Specifically, the dislocation density of the buffer layer 23 is set to not less than $2.0 \times 10^8$ cm$^{-2}$ and not greater than $7.0 \times 10^{10}$ cm$^{-2}$. Furthermore, the half width of the X-ray rocking curve to the (102) plane of the buffer layer 23 is set so that the volume resistivity is maximal over the half width. Specifically, the (102) full width at half maximum is set to not less than 300 seconds and not greater than 2700 seconds.

Still further, the (102)/(002) half width ratio is set to not less than 1.2, and the screw dislocation density ratio is set to not greater than 0.12. The Mg concentration as an impurity concentration of the buffer layer 23 is set to not less than $1 \times 10^{16}$ cm$^{-3}$ and not greater than $1 \times 10^{17}$ cm$^{-3}$. Thus, in the field effect transistor 100, it is possible to obtain a high resistance and a high breakdown voltage of the buffer layer 23 without increasing the threshold voltage. Specifically, the volume resistivity of the buffer layer 23 can be not less than $1.0 \times 10^5$ Ωcm, and the breakdown voltage of the buffer layer 23 can be not less than 400 V. Furthermore, the threshold voltage of 3±1 V is obtained, which in general is preferable in controlling a semiconductor device such as a field effect transistor or the like.

In the second embodiment, the buffer layers 22, 23 and the semiconductor active layer 24 are formed of the nitride-based compound semiconductor, especially of the GaN-based compound semiconductor. The buffer layers 22, 23 and the semiconductor active layer 24 are not limited to the nitride-based or GaN-based, and may be formed of other compound semiconductor.

The present invention has been explained in the first embodiment or second embodiment, and is not limited to the first and second embodiments. Various modifications are possible without departing from the scope of the present invention.

As described above, the present invention is applicable to the semiconductor device including the compound semiconductor layer laminated on the substrate via the buffer layer. Specifically, the present invention is suitable for a field effect transistor formed using a nitride-based compound semiconductor.

What is claimed is:

1. A semiconductor device comprising:
   a substrate;
   a buffer layer; and
   a compound semiconductor layer laminated on the substrate with the buffer layer in between, wherein
   a dislocation density of a material of the buffer layer in a plane in parallel to an in-plane direction thereof is selected so that a volume resistivity of the buffer layer is substantially a maximum value with respect to the dislocation density of the material of the buffer layer, and
   wherein the buffer layer has a ratio of a screw dislocation density thereof to the dislocation density less than 0.12.

2. The semiconductor device according to claim 1, wherein the buffer layer has the dislocation density not less than $2.0 \times 10^8$ cm$^{-2}$ and not greater than $7.0 \times 10^{10}$ cm$^{-2}$.

3. The semiconductor device according to claim 1, wherein the buffer layer has a ratio of a half width of an X-ray rocking curve with respect to a (102) plane thereof to a half width of an X-ray rocking curve to a (002) plane thereof greater than 1.2.

4. The semiconductor device according to claim 1, further comprising a low temperature buffer layer formed between the substrate and the buffer layer, the low temperature buffer layer being formed at a growth temperature of not less than 580° C. and not greater than 620° C.

5. The semiconductor device according to claim 1, wherein the buffer layer includes a composite layer including a first layer formed of a nitride-based compound semiconductor and a second layer formed of a nitride-based compound semiconductor having an Al composition greater than that of the first layer.

6. The semiconductor device according to claim 1, wherein the compound semiconductor layer is formed of a nitride-based compound semiconductor.

7. The semiconductor device according to claim 1 constituting a diode or a field effect transistor.

8. A semiconductor device comprising:
a substrate;
a buffer layer; and
a compound semiconductor layer laminated on the substrate with the buffer layer in between, wherein
a material for the buffer layer is selected to have a half width of an X-ray rocking curve with respect to a (102) plane thereof, the half width of an X-ray rocking curve with respect to a (102) plane corresponding to the material that forms the buffer layer having a substantially maximum value for a volume resistivity with respect to the half width of the X-ray rocking curve, and
the buffer layer has a ratio of a screw dislocation density thereof to a dislocation density less than 0.12.

9. The semiconductor device according to claim 8, wherein the buffer layer has the half width not less than 300 seconds and not greater than 2,700 seconds.

10. The semiconductor device according to claim 8, wherein the buffer layer has a ratio of the half width of the X-ray rocking curve with respect to the (102) plane thereof to a half width of an X-ray rocking curve to a (002) plane thereof greater than 1.2.

11. The semiconductor device according to claim 8, further comprising a low temperature buffer layer formed between the substrate and the buffer layer, the low temperature buffer layer being formed at a growth temperature of not less than 580° C. and not greater than 620° C.

12. The semiconductor device according to claim 8, wherein the buffer layer includes a composite layer including a first layer formed of a nitride-based compound semiconductor and a second layer formed of a nitride-based compound semiconductor having an Al composition greater than that of the first layer.

13. The semiconductor device according to claim 8, wherein the compound semiconductor layer is formed of a nitride-based compound semiconductor.

14. The semiconductor device according to claim 8 constituting a diode or a field effect transistor.

15. A field effect transistor comprising:
a substrate;
a buffer layer; and
a compound semiconductor layer laminated on the substrate with the buffer layer in between, wherein
a dislocation density of a material of the buffer layer in a plane in parallel to an in-plane direction thereof is selected so that a volume resistivity of the buffer layer is substantially a maximum value with respect to the dislocation density of the material of the buffer layer, and
the buffer layer is doped with magnesium to have a magnesium concentration not less than $1 \times 10^{16}$ cm$^{-3}$ and not greater than $1 \times 10^{17}$ cm$^{-3}$.

16. The field effect transistor according to claim 15, wherein the buffer layer magnesium concentration is $5 \times 10^{16}$ cm$^{-3}$.

17. The field effect transistor according to claim 15, wherein the buffer layer has the dislocation density not less than $2.0 \times 10^{8}$ cm$^{-2}$ and not greater than $7.0 \times 10^{10}$ cm$^{-2}$.

18. The field effect transistor according to claim 15, wherein the buffer layer has a ratio of a screw dislocation density thereof to the dislocation density less than 0.12.

19. The field effect transistor according to claim 15, wherein
the buffer layer comprises a plurality of first layers formed of a nitride-based compound semiconductor and a plurality of second layers formed of a nitride-based semiconductor layer having an Al composition greater than that of the plurality of first layers, and
the plurality of first layers and the plurality of second layers are arranged in an alternating fashion.

* * * * *